United States Patent
Johnson et al.

(10) Patent No.: US 7,228,120 B2
(45) Date of Patent: Jun. 5, 2007

(54) CIRCUIT AND METHOD FOR REDUCING DIRECT CURRENT BIASES

(75) Inventors: Terence L. Johnson, Fairfax, VA (US); Nitin Sharma, Centreville, VA (US); Ryan W. Lobo, Arlington, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 385 days.

(21) Appl. No.: 10/990,400

(22) Filed: Nov. 18, 2004

(65) Prior Publication Data

US 2006/0105731 A1 May 18, 2006

(51) Int. Cl.
*H04B 1/10* (2006.01)
(52) U.S. Cl. .......... 455/296; 455/283; 455/284; 455/295; 455/301; 455/303; 455/305; 375/317; 375/319
(58) Field of Classification Search ........... 455/283, 455/284, 295, 296, 301, 303, 305; 375/317, 375/319
See application file for complete search history.

(56) References Cited

U.S. PATENT DOCUMENTS

| | | | |
|---|---|---|---|
| 4,142,110 A * | 2/1979 | Weber | 327/307 |
| 7,072,427 B2 * | 7/2006 | Rawlins et al. | 375/346 |
| 2002/0160734 A1 * | 10/2002 | Li et al. | 455/245.1 |
| 2003/0224752 A1 * | 12/2003 | Rawlins et al. | 455/307 |
| 2004/0002321 A1 * | 1/2004 | Sorrells et al. | 455/323 |
| 2005/0143042 A1 * | 6/2005 | Sorrells et al. | 455/313 |
| 2005/0225395 A1 * | 10/2005 | Gao et al. | 330/289 |
| 2007/0010223 A9 * | 1/2007 | Demir et al. | 455/205 |

* cited by examiner

*Primary Examiner*—Edan Orgad
*Assistant Examiner*—Junpeng Chen (57) ABSTRACT

A method is provided for reducing a DC bias in a receiver. This method includes isolating a second circuit portion from a first circuit portion (535) and determining a second DC bias correction value for the second circuit portion that will eliminate a second DC bias at the isolated second circuit portion (540). The second circuit portion is then connected to the first circuit portion (550) and a bias-maximizing code word is generated at the first circuitry (505). A first DC bias correction value is then determined that will eliminate a first DC bias at the first circuit portion (555). The bias-maximizing code word is formed such that: a first integrated value of a first half of the bias-maximizing code word has a positive value, and a second integrated value of a second half of the bias-maximizing code word over half of the code word length has a negative value.

23 Claims, 6 Drawing Sheets

CIRCUIT AND METHOD FOR REDUCING DIRECT CURRENT BIASES

CROSS-REFERENCE TO RELATED PATENT DOCUMENTS

This application is related to U.S. application Ser. No. 10/990,367, filed Nov. 18, 2004, entitled "CIRCUIT AND METHOD FOR ADJUSTING TIMING ALIGNMENT USING PROGRAMMABLE CODES", the entire contents of which is hereby incorporated by reference in its entirety.

FIELD OF THE INVENTION

The present invention relates in general to wireless communication systems, such as ultra wideband (UWB) systems, including mobile transceivers, centralized transceivers, related equipment, and corresponding methods. In particular, the present invention relates to a wireless receiver that uses a programmable correction code to identify and reduce the presence of a direct current (DC) bias in a receiver circuit. Another aspect of the present invention relates to a method by which successive DC biases are monitored and corresponding bias correction values are iteratively generated throughout a receiver circuit to further reduce the effects of the undesired DC biases.

BACKGROUND OF THE INVENTION

Digital signal processing (DSP) algorithms for a radio receiver are designed based on a set of presumptions about the signal statistics of a received signal. Most DSP algorithms presume a zero mean signal behavior, i.e., that the signal being processed has a zero DC bias. By assuming zero mean signal behavior, the DSP algorithm complexity can be kept simple, which in turn will keep the hardware implementation of that algorithm simple. As a result, receiver circuits will generally be designed such that they will have a zero DC bias.

However, although the receiver circuit may be designed to avoid a DC bias, such bias voltages can nevertheless arise from circuit mismatches, clock leakages, and other non-ideal aspects of a circuit. These DC bias elements can then serve to reduce overall radio performance by violating the presumptions in the receiver's DSP algorithms.

Thus it is generally desirable to both avoid DC biases and to provide methods to correct them when they inevitably appear. It would therefore be desirable to provide a receiver circuit that can minimize the effect of DC biases in its operation.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages in accordance with the present invention.

DETAILED DESCRIPTION OF PREFERRED EMBODIMENTS

First Disclosed DC Bias Reduction Circuit

Figure 1:
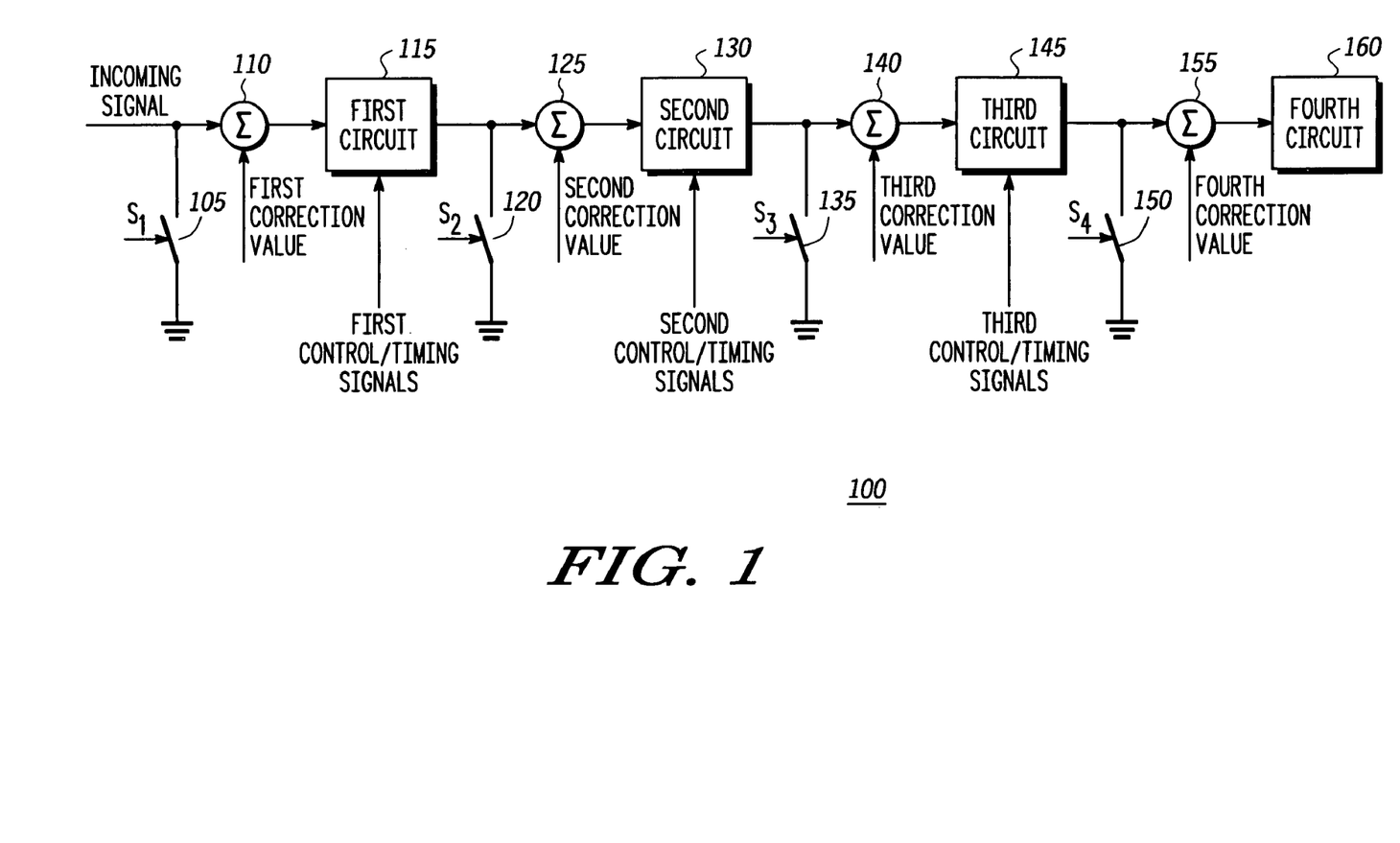
FIG. 1 is a block diagram of a circuit for reducing a direct current voltage bias, according to a first disclosed embodiment of the invention.

FIG. 1 is a block diagram of a receiver circuit for reducing a direct current voltage bias, according to a first disclosed embodiment of the invention;

As shown in FIG. 1, the receiver circuit 100 includes first through fourth switches 105, 120, 135, and 150, first through fourth summers 110, 125, 140, and 155, and first though fourth circuit portions 115, 130, 145, and 160.

In this circuit, an incoming signal is received at one end and is passed through all of the first through fourth circuit portions 115, 130, 145, and 160 in turn. The first through fourth summers 110, 125, 140, and 155 are provided to introduce bias correction values to reduce DC biases in the circuit. The first through fourth switches 105, 120, 135, and 150 are provided to isolate portions of the receiving circuit 100 so that proper correction values can be determined.

The first summer 110 receives an incoming signal, e.g., a UWB signal from a wireless antenna, and adds a first correction value to reduce the DC bias and produce a first corrected signal.

The first circuit portion 115 receives the incoming signal after it has had the first correction value added to it to reduce DC bias (i.e., it receives the first corrected signal) and performs a first signal processing operation on it.

The second summer 125 receives the output of the first circuit portion 115 and adds a second correction value to further reduce the DC bias and produce a second corrected signal.

The second circuit portion 130 receives the output of the first circuit portion 115 after it has had the first correction value added to it to reduce DC bias (i.e., it receives the second corrected signal) and performs a second signal processing operation on it.

The third summer 140 receives the output of the second circuit portion 115 and adds a third correction value to further reduce the DC bias and produce a third corrected signal.

The third circuit portion 145 receives the output of the second circuit portion 130 after it has had the third correction value added to it to reduce DC bias (i.e., it receives the third corrected signal) and performs a third signal processing operation on it.

The fourth summer 155 receives the output of the third circuit portion 115 and adds a fourth correction value to further reduce the DC bias and produce a fourth corrected signal.

The fourth circuit portion 160 receives the output of the third circuit portion 130 after it has had the fourth correction value added to it to reduce DC bias (i.e., it receives the fourth corrected signal) and performs a fourth signal processing operation on it.

The first switch 105 operates in response to a first switch control signal $S_1$ and serves to selectively isolate the first through fourth circuit portions 115, 130, 145, and 160, and the first through fourth summers 110, 125, 140, and 155 from the incoming signal.

The second switch 120 operates in response to a second switch control signal $S_2$ and serves to selectively isolate the second through fourth circuit portions 130, 145, and 160, and the second through fourth summers 125, 140, and 155 from the output of the first circuit portion 115.

The third switch 135 operates in response to a third switch control signal $S_3$ and serves to selectively isolate the third and fourth circuit portions 145 and 160, and the third and fourth summers 140 and 155 from the output of the second circuit portion 130.

The fourth switch 105 operates in response to a fourth switch control signal $S_4$ and serves to selectively isolate the fourth circuit portion 160 and the fourth summer 155 from the output of the third circuit portion 145.

The circuit portions 115, 130, 145, and 160 can include a variety of elements including mixers, amplifiers, integrate and hold circuits, processor circuits, filters, delay circuits, and the like.

The control/timing signals can include clock signals, gain control signals, timing signals, code words, correction codes, delay control signals, and the like.

This receiver circuit 100 can operate in a number of different modes. In an operation mode the circuit 100 passes a received signal for processing by the first through fourth circuit portions 115, 130, 145, and 160 so that data can be extracted. However it is desirable for the reasons set forth above, that the DC bias in this signal path is minimized.

As a result of this, the circuit 100 can also operate in a bias calibration mode in which the influence of the DC bias is maximized. By maximizing the effect of the DC bias, the circuit 100 makes it easier to determine and thus easier to eliminate through the use of the correction values. One way that the circuit 100 could maximize the effect of the DC bias is to provide a bias-maximizing correction code as a control/timing signal to one or more of the circuit portions 115, 130, 145, and 160. Such a code would combine with the signal along the regular signal path and enhance the influence of the DC bias.

In addition to maximizing the DC bias during the calibration mode, the circuit 100 steps through separate portions of the circuit 100 during the calibration mode to iteratively determine proper correction values. As shown in the disclosed embodiments, this process of determining the correction values starts at the farthest point along the signal path and works its way backwards.

By considering smaller circuit portions at a given time, the circuit 100 can more easily determine DC bias values that are present at particular points and can compensate for them along the signal path through the use of the correction values.

In addition, by isolating these circuit portions from portions of the circuit 100 earlier in the signal path using the switches 105, 120, 135, and 150, the circuit 100 can obtain more accurate estimates of the DC bias at any given point.

It may be possible in alternate embodiments to begin estimating bias correction values at a point other than at the farthest point in the signal processing. However, the complexity of such an implementation will be high compared to an implementation starting at the farthest point in the signal processing.

Although FIG. 1 discloses that the four stages of circuit portions and summers each include a switch prior to the summer to isolate the later portion of the signal path from the earlier portion of the signal path, alternate embodiments may eliminate one or more of these switches.

Furthermore, although FIG. 1 discloses four stages of circuit portions, more or fewer circuit portions could be used in alternate embodiments. Each circuit should have a summer placed before it for adding in a proper correction value to the incoming signal. Each circuit could also have a switch prior to the summer to isolate the later portion of the signal path from the earlier portion of the signal path.

Second Disclosed DC Bias Reduction Circuit

Figure 2:
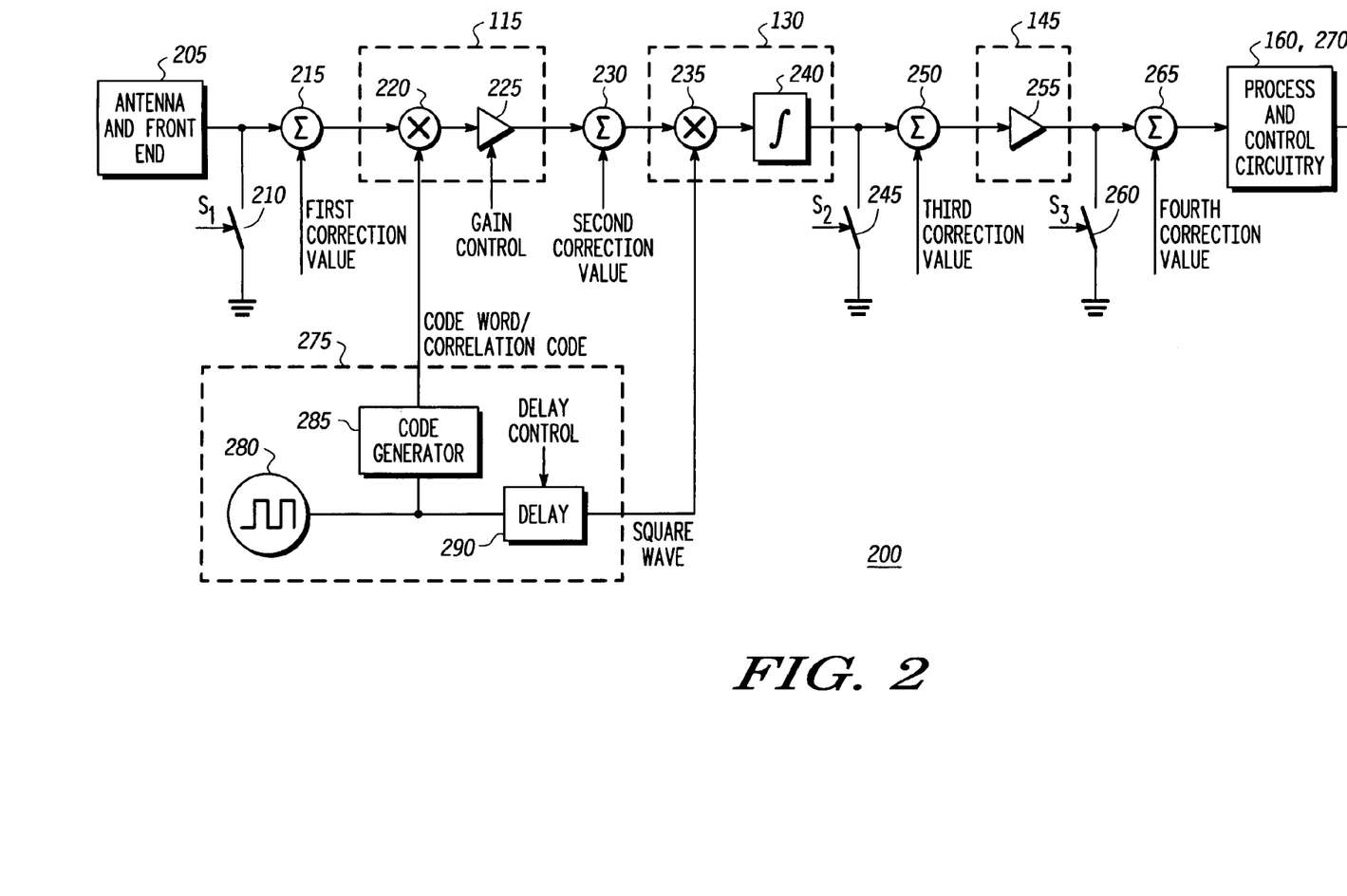
FIG. 2 is a block diagram of a circuit for reducing a direct current voltage bias, according to a first disclosed embodiment of the present invention.

FIG. 2 is a block diagram of a receiver circuit for reducing a direct current voltage bias, according to a first disclosed embodiment of the present invention. As shown in FIG. 2, the receiver circuit 200 includes an antenna and front end 205, first through third switches 210, 245, and 260, first through fourth summers 215, 230, 250, and 265, first and second mixers 220 and 235, first and second amplifiers 225 and 255, an integrate and hold circuit 240, process and control circuitry 270, and a code/timing circuit 275. The code/timing circuit further includes a square wave generator 280, a code generator 285, and a delay circuit 290.

In this circuit, the antenna and front end 205 receives a wireless signal and converts it to an incoming signal that it provides to the signal processing stream of the receiver circuit 200. The mixers 220, 235, the amplifiers 225, 255, the integrate and hold circuit 240, and the process and control circuitry 270 process the incoming signal as it passes down the signal processing stream. The first through fourth summers 215, 230, 250, and 265 are provided to introduce bias correction values to reduce DC biases in the circuit. The first through third switches 210, 245, and 260 are provided to isolate portions of the receiving circuit 200 so that proper correction values can be determined.

The first summer 215 receives the incoming signal, e.g., a UWB signal received from the antenna and front end, and adds a first correction value to reduce the DC bias and produce a first corrected signal.

The first mixer 220 receives the incoming signal after it has had the first correction value added to it to reduce DC bias (i.e., it receives the first corrected signal) and mixes it with either a code word or a correction code provided by the code generator 285, depending upon the operational status of the circuit 200, to generate a first mixed signal. When the circuit 200 is in a receive mode, it mixes the first corrected signal with a code word; when the circuit 200 is in a bias calibration mode, it mixes the first corrected signal with a correction code.

The code word or correction code received by the first mixer 220 is preferably mixed in the code generator 285 with a square wave provided by the square wave generator 280 having a frequency equal to the frequency of the code word or correction code. This square wave is used to help manipulate the effects of the DC bias on the code word/correction code.

The first amplifier 225 receives and amplifies the first mixed signal. In the disclosed embodiment the first amplifier 225 is a programmable-gain band pass filter. In alternate embodiments the first amplifier 225 could be split up into multiple amplifiers.

The second summer 230 receives the output of the first amplifier 225 and adds a second correction value to further reduce the DC bias and produce a second corrected signal.

The second mixer 235 receives the output of the first amplifier 225 after it has had the first correction value added to it to reduce DC bias (i.e., it receives the second corrected signal) and mixes it with a square wave to generate a second mixed signal.

The integrate and hold circuit 240 integrates the second mixed signal over the length of a code word or correction code and holds this value as an integrated output.

The third summer 250 receives the output of the integrate and hold circuit 240 and adds a third correction value to further reduce the DC bias and produce a third corrected signal.

The second amplifier 255 receives the output of the integrate and hold circuit 240 after it has had the third correction value added to it to reduce DC bias (i.e., it receives the third corrected signal) and amplifies it to produce a second amplified signal. In alternate embodiments the second amplifier 255 could be split up into multiple amplifiers.

The fourth summer 265 receives the output of the second amplifier 255 and adds a fourth correction value to further reduce the DC bias and produce a fourth corrected signal.

The process and control circuitry 270 performs further processing steps on the fourth correction signal. In a receive mode, the process and control circuitry 270 performs the signal processing steps necessary to receive a signal and extract the data from it. In a calibration mode the process and control circuitry 270 calculates and provides the first through fourth correction values and the delay control signal based on the fourth corrected signal.

The square wave generator 280 generates a square wave at a set square wave frequency. In the disclosed embodiment the square wave generator 280 generates a square wave at the frequency of a code word or a correction code.

The code generator 285 generates code words or a correction codes at a given code frequency. In one embodiment these code words or correction codes are comprised of a plurality of binary- or ternary-encoded wavelets. The wavelets can be any kind of bi-phase wavelets, including repeated cycles of sine waves, bi-phase Gaussian monopulses, rectified sine waves, or the like.

The code words and correction codes generated by the code generator 285 can be set to include any desired number of wavelets. When the DC bias is to be minimized these correction codes can have an even number of wavelets; and when the DC bias is to be maximized the correction codes can have an odd number of wavelets However, any desired length that meets the necessary criteria can be used. In some embodiments, a limited number of operational code words and correction codes may be available. In this case it may be desirable to only use code words/correction codes with even numbers of wavelets. In this case an odd number of codes can be concatenated when a DC bias enhancing code is needed, and this new code can be used as a correction code.

After being formed, the code word or correction code is then mixed in the code generator 285 with the square wave generated by the square wave generator 280 and the result is provided to the first mixer 220.

The delay circuit 290 receives the square wave from the square wave generator 280 and delays it to produce a delayed square wave received by the second mixer 235.

The first switch 210 operates in response to a first switch control signal $S_1$ and serves to selectively isolate the first through fourth summers 215, 230, 250, and 265, the first and second mixers 220 and 235, the first and second amplifiers 225 and 255, the integrate and hold circuit 240, the process and process and control circuitry 270, the oscillator 280, the code generator 285, and the delay circuit 290 from the incoming signal.

The second switch 245 operates in response to a second switch control signal $S_2$ and serves to selectively isolate the third and fourth summers 250 and 265, the second amplifier 255, and the process and control circuitry 270 from the integrated signal.

The third switch 260 operates in response to a third switch control signal $S_3$ and serves to selectively isolate the fourth summer 265 and the process and control circuitry 270 from the second amplified signal.

The modulated code word/correction code provided by the code generator 285 used in combination with the delayed square wave provided by the delay circuit 290 allows the circuit 200 to better control the effect of the DC bias on the main signal path.

If an even code word/correction code is used (i.e., one whose first half and second half both integrate to the same value over half the code word/correction code length), then the modulation of the code word/correction code by the square wave will operate to cancel out effects of a DC bias over one integration interval of the integrate and hold circuit 240. In this case, half of the code word/correction code (including any DC bias) will be multiplied by a positive square wave voltage and the other half of the code word/correction code (including the DC bias) will be multiplied by a corresponding negative square wave voltage. Because the correction code is even, the DC bias portions in each modulated half of the correction code will be equal in magnitude but opposite in polarity. When integrated over an entire code word/correction code the DC bias portion of each of the two opposite polarity halves will therefore cancel out.

If an odd code word/correction code is used (i.e., one whose first half and second half do not both integrate to the same value over half the code word/correction code length), then the modulation of the code word/correction code by the square wave will operate to enhance the effects of a DC bias over one integration interval of the integrate and hold circuit 240. In this case, half of the code word/correction code (including any DC bias) will be multiplied by a positive square wave voltage and the other half of the code word/correction code (including the DC bias) will be multiplied by a corresponding negative square wave voltage. Because the two halves of the correction code word are not equivalent, when integrated over an entire code word/correction code the DC bias portion of the half with the greater integrated magnitude will exceed the DC bias portion of the half with the lesser integrated magnitude, and a positive or negative bias will remain.

The delayed square wave introduced at the second mixer 235 operates to return the code word/correction code to its unmodulated values before it was mixed with the square wave. In order for it to accomplish this, the delayed square wave should have the same phase as the signal received at the other input of the second mixer 235. In other words, the delayed square wave should coincide with the effect of the original square wave that modulates the code word/correction code in order to cancel it out (i.e., the positive section of a cycle will multiply with the positive section and the negative section of the cycle will multiply with the negative section).

However, given the delays inherent in the code generator 285, first mixer 220, first amplifier 225 and second summer 230, the square wave output from the square wave generator 280 must be delayed by the delay circuit by a set delay to amount to achieve this timing alignment. One way of achieving this timing alignment process is disclosed in U.S. application Ser. No. 10/990,367, filed Nov. 18, 2004, entitled "CIRCUIT AND METHOD FOR ADJUSTING TIMING ALIGNMENT USING PROGRAMMABLE CODES," though other methods are possible.

As with the circuit 100 of FIG. 1, the circuit 200 of FIG. 2 can operate in a number of different modes. These include an operation mode, a timing alignment mode, and a bias calibration mode.

In an operation mode, where the circuit 200 passes a received signal for processing along the signal path so that data can be extracted, and in a timing alignment mode, where the circuit 200 operates to align the inputs of the second mixer 235, it is desirable that the correction code used for this mode minimize the effect of the DC bias. In a bias calibration mode, however, where the circuit 200 determines the parameters of any DC biases in order to correct for them, it is desirable that the correction code used for this mode maximize the effect of the DC bias.

Furthermore, in addition to maximizing the DC bias during the calibration mode, the circuit 200 steps through separate portions of the circuit 200 during the calibration mode to iteratively determine proper correction values. As shown in the disclosed embodiments, this process of determining the correction values starts at the farthest point along the signal path and works its way backwards.

By considering smaller circuit portions at a given time, the circuit 200 can more easily determine DC bias values that are present at particular points and can compensate for them along the signal path through the use of the correction values.

In addition, by isolating these circuit portions from portions of the circuit 200 earlier in the signal path using the switches 210, 245, and 260, the circuit 200 can obtain more accurate estimates of the DC bias at any given point. In alternate embodiments it is possible to begin estimating the bias values in the circuit 200 at a point other than at the end of the signal path. However, such a process would require increased complexity in the process.

Figure 3:
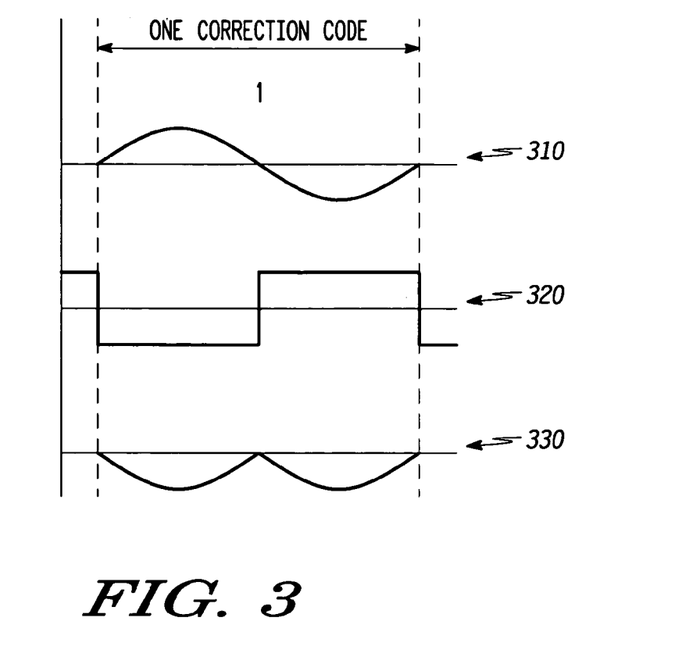
FIGS. 3 and 4 are graphs of the signal processed by the pulse forming network of FIG. 1 when a bias-maximizing correction code is used, according to disclosed embodiments of the present invention.
Figure 4:
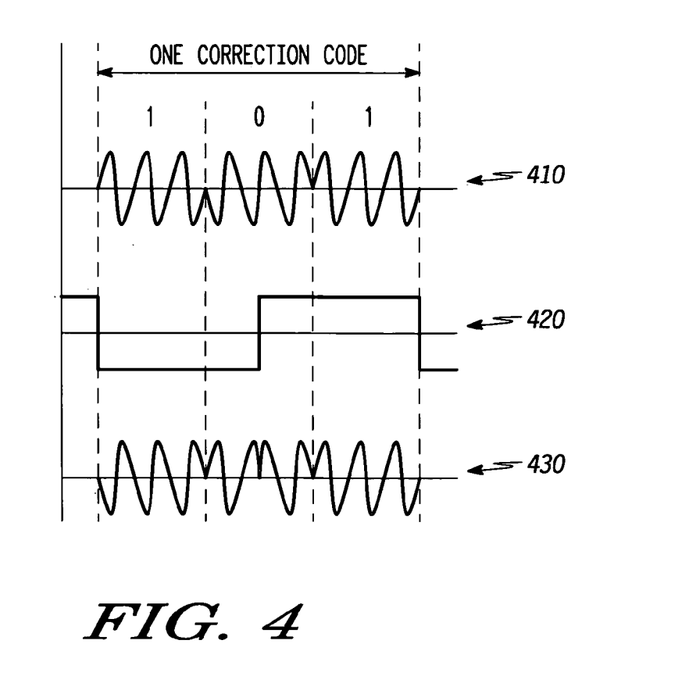

FIGS. 3 and 4 are graphs of the signal processed by the pulse forming network of FIG. 1 when a bias-maximizing correction code is used, according to disclosed embodiments of the present invention. FIG. 3 is a graph describing the formation of a first bias-maximizing correction code; and FIG. 4 is a graph describing the formation of a second bias-maximizing correction code.

As shown in FIG. 3, a first bias-maximizing correction code is formed from a single chip having a single cycle of a sine wave. When this single cycle of a sine wave is multiplied by the square wave (which must have the same frequency as the correction code) to form the modulated correction code, the result is a signal whose integrated result over the correction code period is a large negative number. If the opposite orientation of the correction code were used, then the modulated correction code would be a signal that integrates into a large positive value. In either case, the modulated correction code will integrate to a large value, accentuating the effect of any DC bias, thus allowing the process and control circuitry 270 to better identify it.

FIG. 4 discloses a correction code formed of three chips each having three cycles of a sine wave. When these nine cycles of a sine wave are multiplied by the square wave (which must have the same frequency as the correction code) to form the modulated correction code, the result is a signal whose integrated result over the correction code period is a positive value. If the opposite orientation of the correction code were used, then the modulated correction code would be a signal that integrates into a negative value. In either case, the modulated correction code will integrate to a non-zero value, accentuating the effect of any DC bias, thus allowing the process and control circuitry 270 to better identify it.

Although FIG. 3 discloses a correction code formed from a single chip having a single cycle of a sine wave, and FIG. 4 discloses a correction code formed of three chips each having three cycles of a sine wave, alternate embodiments could use different chip sizes and different correction code sizes. In addition, alternate embodiments could also use different bi-phase wavelets such as Gaussian monopulses, rectified sine waves, or the like.

The single cycle sine wave correction code of FIG. 3 is also a good estimate for the resultant waveform after a multiple-cycle imbalanced correction code is filtered and integrated. The positive half of the imbalanced correction code produces a signal similar to the positive cycle of a sine wave when filtered and integrated, and the negative half of the imbalanced correction code produces a signal similar to the negative cycle of a sine wave when filtered and integrated.

When using regular wavelets, such as those comprising sine wave cycles as shown in FIGS. 3 and 4, one way to make certain that the correction code will integrate to a non-zero value is to employ a correction code made up of an odd number of regular wavelets. In this way the first half of the correction code will always integrate to a different value than the second half of the correction code, guaranteeing that the modulated correction code will integrate to a non-zero value.

First Disclosed Method of DC Bias Reduction

Figure 5:
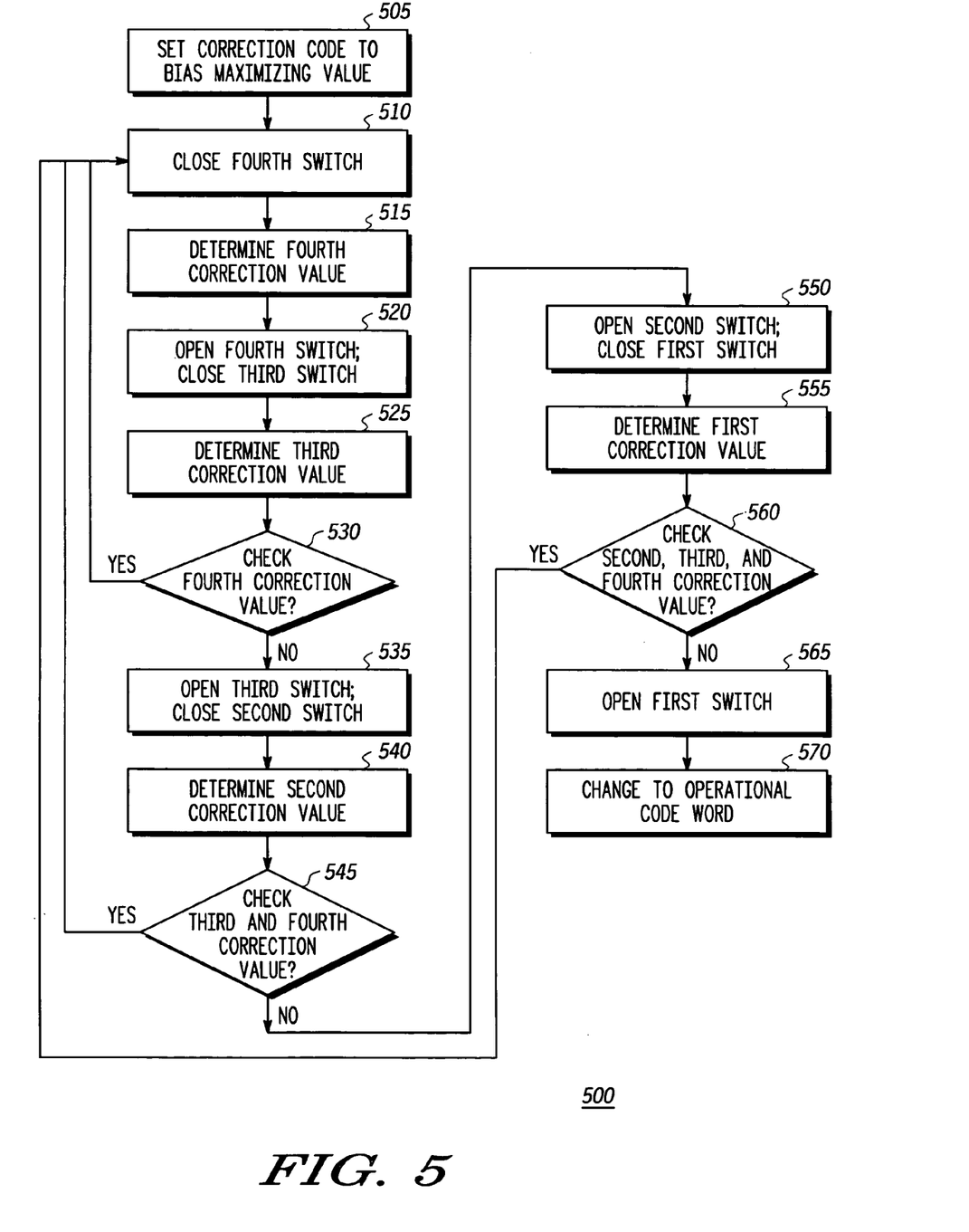
FIG. 5 is a flow chart of a method of reducing a direct current voltage bias, according to one disclosed embodiment of the present invention.

FIG. 5 is a flow chart of a method of reducing a direct current voltage bias, according to one disclosed embodiment of the present invention. This operation is described with respect to the circuit of FIG. 1.

As shown in FIG. 5, in the disclosed embodiment the DC bias reduction process begins when a correction code used by the circuit 100 is set to a bias-maximizing correction code. (Step 505) This correction code is a code that will enhance the measurable effects of the DC bias so that it will be easier to determine, and thus easier to compensate for. The correction code can be used as all or part of any of the first through third control/timing signals.

The determination of bias correction values is then begun, stepping back from a later portion of the signal processing path to an earlier portion of the signal processing path. In particular, the method begins determining the DC bias caused at the input of the fourth circuit portion 160 by closing the fourth switch 150 to isolate the fourth summer 155 and the fourth circuit portion 160 from the effects of all circuitry prior to them on the signal processing path. (Step 510)

The fourth circuit portion 160 then determines the measurable DC bias it receives, which is primarily caused by its own input, and sets the fourth correction value to compensate for this DC bias portion. (Step 515)

The fourth switch 150 is then opened and the third switch 135 is closed to isolate the third and fourth summers 140 and 155, and the third and fourth circuit portions 145 and 160 from the effects of all circuitry prior to them on the signal processing path. (Step 520)

Because the fourth correction value should be compensating for any DC bias caused at the input of the fourth circuit portion 160, the primary cause of any remaining DC bias on the current signal path should be caused by the input of the third circuit portion 145. The fourth circuit portion 160 then determines the measurable DC bias it receives and sets the third correction value to compensate for this DC bias portion. (Step 525)

At this point it may be desirable to revise the fourth correction value based on the operations required for determining the third correction value. For example, the process of determining the third correction value may itself modify the DC bias portion compensated by the fourth correction value.

If desired, a determination is made to see if it is necessary to revise the fourth correction value based on the determination of the third correction value in Step 525. (Step 530) In alternate embodiments this step may be omitted if there are no cases where the fourth correction value must be revised based on the determination of the third correction value.

If the circuit 100 determines in Step 530 that the fourth correction value should be reexamined, processing will return to Step 510 where processing will continue as before with the third and fourth correction values being again determined. (Steps 510 to 525)

If the circuit 100 determines in Step 530 that the fourth correction value need not be reexamined, processing will continue. The third switch 135 will be opened and the second switch 120 closed to isolate the second through fourth summers 125, 140, and 155, and the second through fourth circuit portions 130, 145, and 160 from the effects of all circuitry prior to them on the signal processing path. (Step 535)

Because the third and fourth correction values should be compensating for any DC bias caused at the inputs of the third and fourth circuit portions 145 and 160, respectively, the primary cause of any remaining DC bias on the current signal path should be caused by the input of the second circuit portion 130. The fourth circuit portion 160 then determines the measurable DC bias it receives and sets the third correction value to compensate for this DC bias portion. (Step 540)

At this point it may be desirable to revise the third and fourth correction values based on the operations required for determining the second correction value. For example, the process of determining the second correction value may itself modify the DC bias portion compensated by the third and fourth correction values.

If desired, a determination is made to see if it is necessary to revise the third and fourth correction values based on the determination of the second correction value in Step 540. (Step 545) In alternate embodiments this step may be omitted if there are no cases where the third and fourth correction values must be revised based on the determination of the second correction value.

If the circuit 100 determines in Step 545 that the third and fourth correction values should be reexamined, processing will return to Step 510 and will continue as before with the second, third, and fourth correction values being again determined. (Steps 510 to 540)

If the circuit 100 determines in Step 545 that the third and fourth correction values need not be reexamined, processing will continue. The second switch 120 will be opened and the first switch 105 closed to isolate the first through fourth summers 105, 125, 140, and 155, and the first through fourth circuit portions 115, 130, 145, and 160 from the effects of the incoming signal. (Step 550)

Because the second, third, and fourth correction values should be compensating for any DC bias caused at the inputs of the second, third, and fourth circuit portions 130, 145, and 160, respectively, the primary cause of any remaining DC bias on the current signal path should be caused by the input of the first circuit portion 115. The fourth circuit portion 160 then determines the measurable DC bias it receives and sets the first correction value to compensate for this DC bias portion. (Step 555)

At this point it may be desirable to revise the second, third, and fourth correction values based on the operations required for determining the first correction value. For example, the process of determining the first correction value may itself modify the DC bias portion compensated by the second, third, and fourth correction values. In particular, the DC bias portion may be affected by other intermediate calibration mechanisms such as timing enhancements. Adjustments to the timing may affect DC bias figures, requiring recalibration.

If desired, a determination is made to see if it is necessary to revise the second, third, and fourth correction values based on the determination of the first correction value in Step 555. (Step 560) In alternate embodiments this step may be omitted if there are no cases where the second, third, and fourth correction values must be revised based on the determination of the first correction value.

If the circuit 100 determines in Step 560 that the second, third, and fourth correction values should be reexamined, processing will return to Step 510 and will continue as before with the first, second, third, and fourth correction values being again determined. (Steps 510 to 555)

If the circuit 100 determines in Step 560 that the second, third, and fourth correction values need not be reexamined, processing will continue. The first switch 105 will be opened (Step 565) and the circuit will change to using an operational code word to process incoming signals (Step 565).

Although in the method shown in FIG. 5, Step 505 is shown as being performed first, this step can be delayed until immediately prior to a step in which the current DC bias estimation includes a circuit portion that uses the correction code as a control/timing signal.

In addition, although the method if FIG. 5 discloses that when correction values need to be revised they are all revised, it is also possible that smaller subsets of correction values are revised at different points.

Second Disclosed Method of DC Bias Reduction

Figure 6:
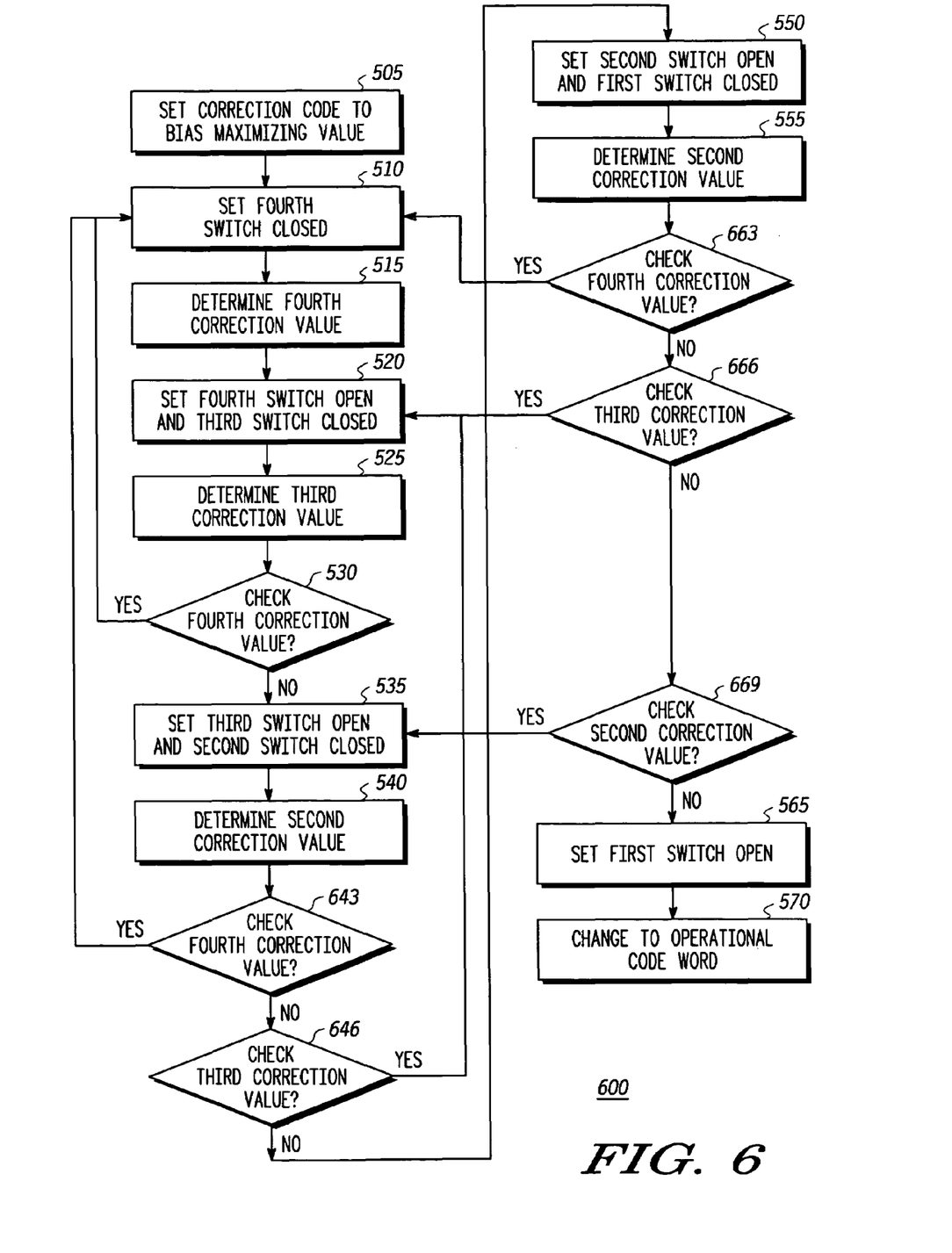
FIG. 6 is a flow chart of a method of reducing a direct current voltage bias, according to another disclosed embodiment of the present invention.

FIG. 6 is a flow chart of a method of reducing a direct current voltage bias, according to another disclosed embodiment of the present invention. This operation is described with respect to the circuit of FIG. 1 and allows for a more nuanced approach to revising DC bias correction values. As shown in FIG. 6, like numbered steps operate as described above with respect to FIG. 5.

The method of FIG. 6 differs from that of FIG. 5 in that the method of FIG. 6 allows the circuit to better control what calibration steps are repeated.

For example, after the determination of the second correction value in step 540, it may be desirable to revise one or both of the third and fourth correction values based on the operations required for determining the second correction value. In this case, two opportunities are given to revise correction values, one for the fourth correction value (Step 643) and one for the third correction value (Step 646). If the fourth correction value is to be revised then the operation returns to Step 510, and if the third correction value is to be revised then the operation returns to Step 520.

Likewise, after the determination of the first correction value in step 555, it may be desirable to revise any of the second, third, and fourth correction values based on the operations required for determining the first correction value. In this case, three opportunities are given to revise correction values, one for the fourth correction value (Step 663), one for the third correction value (Step 666), and one for the second correction value (Step 669). If the fourth correction value is to be revised then the operation returns to Step 510; if the third correction value is to be revised then the operation returns to Step 520; and if the second correction value is to be revised then the operation returns to Step 535.

Alternate embodiments can also provide more complicated methods for revising correction values. For example, in some alternate embodiments it would be possible to revise to a single correction value without having to revise all of the subsequent correction values.

Third Disclosed Method of DC Bias Reduction

Figure 7:
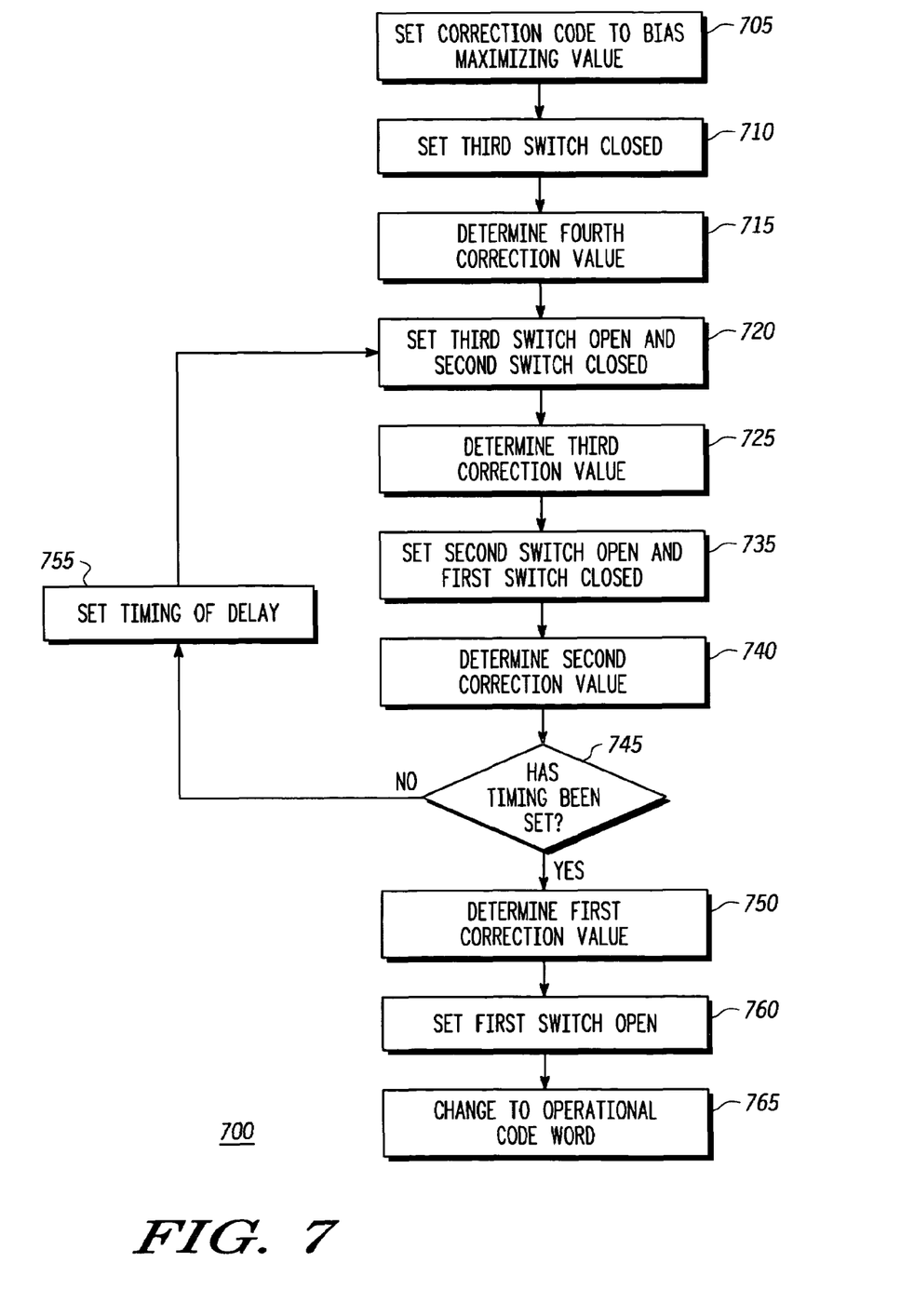
FIG. 7 is a flow chart of a method of reducing a direct current voltage bias, according to yet another disclosed embodiment of the present invention.

FIG. 7 is a flow chart of a method of reducing a direct current voltage bias, according to yet another disclosed embodiment of the present invention. This operation is described with respect to the circuit of FIG. 2.

As shown in FIG. 7, in the disclosed embodiment the DC bias reduction process begins when the code generator 285 sets its output to a bias-maximizing correction code. (Step 705) This correction code is a code that will enhance the measurable effects of the DC bias so that it will be easier to determine, and thus easier to compensate for.

The determination of bias correction values is then begun, stepping back from a later portion of the signal processing path to an earlier portion of the signal processing path. In particular, the method begins determining the DC bias caused at the input of the process and control circuitry 270 by closing the third switch 260 to isolate the fourth summer 265 and the process and control circuitry 270 from the effects of all circuitry prior to them on the signal processing path. (Step 710)

The process and control circuitry 270 then determines the measurable DC bias it receives, which is primarily caused by its own input, and sets the fourth correction value to compensate for this DC bias portion. (Step 715)

The third switch 260 is then opened and the second switch 245 is closed to isolate the third and fourth summers 250, 265, the second amplifier 255, and the process and control circuitry 270 from the effects of all circuitry prior to them on the signal processing path. (Step 720)

Because the fourth correction value should be compensating for any DC bias caused at the input of the process and control circuitry 270, the primary cause of any remaining DC bias on the current signal path should be caused by the input of the second amplifier 255. The process and control circuitry 270 then determines the measurable DC bias it receives and sets the third correction value to compensate for this DC bias portion. (Step 725)

The second switch 245 is then opened and the first switch 210 is closed to isolate the first through fourth summers 215, 230, 250, and 265, the first and second mixers 220 and 235, the first and second amplifiers 225 and 255, the integrate and hold circuit 240, the process and process and control circuitry 270, the oscillator 280, the code generator 285, and the delay circuit 290 from the incoming signal. (Step 735)

Because the third and fourth correction values should be compensating for any DC bias caused at the inputs of the process and control circuitry 270 and the second amplifier 255, the primary cause of any remaining DC bias on the current signal path should be caused by the first and second mixers 220, 235, the first amplifier 255, the integrate and hold circuit 240, the oscillator 280, the code generator 285, and the delay circuit 290. The process and control circuitry 270 then determines the measurable DC bias it receives and sets the second correction value to best compensate for the DC bias it calculates is likely caused by the second mixer 235 and the integrate and hold circuit 240. (Step 740) No switch is used to isolate the input of the second summer 230 to avoid reducing the performance of the first amplifier 225. In particular, if the DC biases are large, even though they would integrate to zero, the second summer 230 could experience saturation.

The circuit then determines whether the timing of the delay circuit 290 has been set to make certain that the phases of the signals input at the second mixer 235 are in alignment. (Step 745) If the timing has not been set, then a timing alignment process is performed to set the timing of the delay circuit 290. (Step 755) This timing alignment process can be performed as set forth in U.S. application Ser. No. 10/990, 367, filed Nov. 18, 2004, entitled "CIRCUIT AND METHOD FOR ADJUSTING TIMING ALIGNMENT USING PROGRAMMABLE CODES," though other methods are possible. This step may involve altering the correction code used by the circuit 100. If so, the correction code should be returned to its bias-maximizing value before this step is completed.

After the timing delay is set in Step 755, the process repeats steps 720, 725, 735, and 740 to revise its estimate of the second and third correction values. This is because the process of determining the first correction value may itself modify the DC bias portion compensated by the second, third, and fourth correction values, as noted above.

If the circuit 200 determines is Step 745 that the timing of the delay circuit 290 has already been set, then the process and control circuitry 270 proceeds to determine the measurable DC bias it receives and set the first correction value to best compensate for the DC bias it calculates, which is likely caused by the first mixer 220 and the first amplifier 225. (Step 750)

Once the first correction value is set, the circuit 200 opens the first switch 210 (Step 760), and causes the code generator 285 to output an operational code word (Step 765) to process incoming signals.

In alternate embodiments Steps 735 and 740 may be eliminated. In this case the second summer 230 can be removed from the circuit 200 and the first summer 215 will compensate for the DC bias in the second mixer 235 and the integrate and hold circuit 240 as well as for the DC bias in the first mixer 220 and the first amplifier 225.

Although in the method shown in FIG. 7, Step 705 is shown as being performed first, this step can be delayed until any point prior to Step 735, at which point the DC bias estimation will include the first mixer, which receives the modulated correction code as an input.

CONCLUSION

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A method for reducing a DC bias in a receiver, comprising:
   isolating a second circuit portion from a first circuit portion;
   determining a second DC bias correction value for the second circuit portion that will eliminate a second DC bias at the isolated second circuit portion;
   connecting the second circuit portion to the first circuit portion;
   generating a bias-maximizing code word at the first circuitry; and
   determining a first DC bias correction value for the first circuit portion that will eliminate a first DC bias at the first circuit portion,
   wherein the bias-maximizing code word is formed such that:
      a first integrated value of a first half of the bias-maximizing code word has a positive value, and
      a second integrated value of a second half of the bias-maximizing code word over half of the code word length has a negative value.

2. A method for reducing a DC bias in a receiver, as recited in claim 1, wherein the step of isolating a second circuit portion from the first circuit portion is performed by grounding a first connection between the first circuit portion and the second circuit portion.

3. A method for reducing a DC bias in a receiver, as recited in claim 1, further comprising revising the second DC bias correction value after the step of determining the first DC bias correction value.

4. A method for reducing a DC bias in a receiver, as recited in claim 1, further comprising, prior to the step of isolating the second circuit portion:
   isolating a third circuit portion from the first and second circuit portions;
   determining a third DC bias correction value for the third circuit portion that will eliminate a third DC bias at the isolated third circuit portion;
   connecting the third circuit portion to the first and second circuit portions.

5. A method for reducing a DC bias in a receiver, as recited in claim 4, further comprising revising the second DC bias correction value after the step of determining the first DC bias correction value.

6. A method for reducing a DC bias in a receiver, as recited in claim 5, further comprising revising the third DC bias correction value after the step of revising the second DC bias correction value.

7. A method for reducing a DC bias in a receiver, as recited in claim 4, further comprising revising the third DC bias correction value after the step of determining the first DC bias correction value.

8. A method for reducing a DC bias in a receiver, as recited in claim 7, wherein the step of isolating a third circuit portion from the first and second circuit portions is performed by grounding a connection between the third circuit portion and the first and second circuit portions.

9. A method for reducing a DC bias in a receiver, as recited in claim 1, further comprising, further comprising, prior to the step of isolating the third circuit portion:
   isolating a fourth circuit portion from the first, second, and third circuit portions;
   determining a fourth DC bias correction value for the fourth circuit portion that will eliminate a fourth DC bias at the isolated fourth circuit portion;
   connecting the fourth circuit portion to the first, second, and third circuit portions.

10. A method for reducing a DC bias in a receiver, as recited in claim 1, wherein the method is implemented in an integrated circuit.

11. A method for reducing a DC bias in a receiver, as recited in claim 1, wherein the method is implemented in an ultrawide bandwidth device.

12. A receiver circuit for reducing DC bias, comprising:
    a first summer receiving an incoming signal at a first summer input and a first correction value at a second summer input, and summing the incoming signal and the first correction value to produce a first corrected signal at a first summer output;
    a first circuit portion connected to the first summer output and performing one or more first operations on the first corrected signal to produce a first processed signal at a first circuit output;
    a second summer receiving the first processed signal at a third summer input and a second correction value at a fourth summer input, and summing the first processed signal and the second correction value to produce a second corrected signal at a second summer output;
    a second circuit portion connected to the second summer output and performing one or more second operations on the second corrected signal to produce a second processed signal;
    a first switch for selectively connecting the first circuit output and the third summer input to ground in response to a first switch control signal; and
    control circuitry for generating the first switch control signal, and for determining the first correction value and the second correction value in response to the second processed signal.

13. A receiver circuit for reducing DC bias, as recited in claim 12, wherein the first circuit portion comprises a mixer and an integrator.

14. A receiver circuit for reducing DC bias, as recited in claim 12, wherein the second circuit portion comprises an amplifier.

15. A receiver circuit for reducing DC bias, as recited in claim 12, further comprising a second switch for selectively connecting a first circuit input of the first circuit to ground in response to a second switch control signal;.

16. A receiver circuit for reducing DC bias, as recited in claim 12, wherein the first circuit portion further comprises:
    a first mixer for mixing the incoming signal with a first code word to produce a first mixed signal;
    a third summer receiving the first mixed signal at a fifth summer input and a third correction value at a sixth summer input, and summing the first mixed signal and the third correction value to produce a third corrected signal at a third summer output;

a second mixer for mixing the third corrected signal with a second code word to produce a second mixed signal; and an integrator for integrating the second mixed signal over a code frequency to produce the first processed signal, wherein the first and second codes words are generated at the code frequency.

17. A receiver circuit for reducing DC bias, as recited in claim 16, wherein the first code word is a bias-maximizing code word formed such that:

a first integrated value of a first half of the first code word has a positive value, and a second integrated value of a second half of the first code word over half of the code word length has a negative value.

18. A receiver circuit for reducing DC bias, as recited in claim 16, wherein the second code word is a square wave.

19. A receiver circuit for reducing DC bias, as recited in claim 16, further comprising a variable gain amplifier connected between the first mixer and the third summer.

20. A receiver circuit for reducing DC bias, as recited in claim 16, further comprising a second switch for selectively connecting a first circuit input of the first circuit to ground in response to a second switch control signal.

21. A receiver circuit for reducing DC bias, as recited in claim 16, further comprising:

a square wave generator for generating a base square wave at the code frequency;

a code generator for generating the first code word in response to the base square wave; and a delay circuit for delaying the base square wave to form the second code word.

22. A receiver circuit for reducing DC bias, as recited in claim 12, wherein the receiver circuit is implemented in an integrated circuit.

23. A receiver circuit for reducing DC bias, as recited in claim 12, wherein the receiver circuit is implemented in an ultrawide bandwidth device.

* * * * *